(12) United States Patent
Zhao

(10) Patent No.: US 12,140,841 B2
(45) Date of Patent: Nov. 12, 2024

(54) DISPLAY PANEL AND DEVICE

(71) Applicant: TCL CHINA STAR OPTOELECTRONICS TECHNOLOGY CO., LTD., Shenzhen (CN)

(72) Inventor: He Zhao, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 510 days.

(21) Appl. No.: 17/431,125

(22) PCT Filed: Dec. 29, 2020

(86) PCT No.: PCT/CN2020/140598
§ 371 (c)(1),
(2) Date: Aug. 13, 2021

(87) PCT Pub. No.: WO2021/174975
PCT Pub. Date: Sep. 10, 2021

(65) Prior Publication Data
US 2022/0206349 A1 Jun. 30, 2022

(30) Foreign Application Priority Data
Mar. 4, 2020 (CN) .......................... 202010145410.0

(51) Int. Cl.
*G02F 1/1362* (2006.01)
*G02F 1/1343* (2006.01)
(Continued)

(52) U.S. Cl.
CPC .... *G02F 1/136286* (2013.01); *G02F 1/13439* (2013.01); *G02F 1/136209* (2013.01);
(Continued)

(58) Field of Classification Search
None
See application file for complete search history.

(56) References Cited

U.S. PATENT DOCUMENTS

2015/0205171 A1 7/2015 Tsuruma et al.
2022/0357810 A1* 11/2022 Bae ...................... H10K 59/122

FOREIGN PATENT DOCUMENTS

| CN | 102360146 A | 2/2012 |
| CN | 102385200 A | 3/2012 |
(Continued)

OTHER PUBLICATIONS

Google machine tranlation CN 105789264 A downloarded Jan. 9, 2024.*

(Continued)

*Primary Examiner* — Michael Lebentritt
(74) *Attorney, Agent, or Firm* — PV IP PC; Wei Te Chung

(57) ABSTRACT

A display panel and a device are provided. The display panel includes a first substrate. The first substrate includes a first metal layer and a second metal layer. The first metal layer includes first metal portions. Each of the first metal portions includes a plurality of second sub-portions arranged along a second direction. The second metal layer includes a plurality of data lines. Each of the second sub-portions is disposed between two adjacent data lines. In a top view, the display panel includes a plurality of columns of pixels or a plurality of rows of pixels. Each of two sides of each of the columns of pixels is provided with one of the data lines.

19 Claims, 3 Drawing Sheets

(51) Int. Cl.
*G02F 1/1368* (2006.01)
*H01L 27/12* (2006.01)
(52) U.S. Cl.
CPC ...... *G02F 1/136222* (2021.01); *G02F 1/1368* (2013.01); *H01L 27/124* (2013.01); *H01L 27/1255* (2013.01)

(56) References Cited

FOREIGN PATENT DOCUMENTS

| | | | |
|---|---|---|---|
| CN | 102768444 | A | 11/2012 |
| CN | 104570530 | A | 4/2015 |
| CN | 104950540 | A | 9/2015 |
| CN | 105140246 | A | 12/2015 |
| CN | 105629612 | A | 6/2016 |
| CN | 105789264 | A | 7/2016 |
| CN | 107340665 | A | 11/2017 |
| CN | 207181908 | U | 4/2018 |
| CN | 108254985 | A | 7/2018 |
| CN | 108761937 | A | 11/2018 |
| CN | 109491130 | A | 3/2019 |
| CN | 111243439 | A | 6/2020 |
| JP | 2003173154 | A | 6/2003 |
| KR | 20060000288 | A | 1/2006 |
| WO | WO-2018006477 | A1 * | 1/2018 |

OTHER PUBLICATIONS

International Search Report in International application No. PCT/CN2020/140598, mailed on Mar. 16, 2021.

* cited by examiner

DISPLAY PANEL AND DEVICE

RELATED APPLICATIONS

This application is a Notional Phase of PCT Patent Application No. PCT/CN2020/140598 having international filing date of Dec. 29, 2020, which claims the benefit of priority of Chinese Patent Application No. 202010145410.0 filed on Mar. 4, 2020. The contents of the above applications are all incorporated by reference as if fully set forth herein in their entirety.

FIELD OF DISCLOSURE

The present disclosure relates to the field of display technologies, in particular to a display panel and a device.

BACKGROUND

The higher the resolution of a display panel, the higher the clarity of a screen.

The resolution of the display panel is also a precision of the screen. The resolution is proportional to a number of pixels in the display panel. The more pixels in the screen, the clearer the images. However, it is limited by a structure of an existing display panel, and the resolution cannot be effectively improved.

SUMMARY OF DISCLOSURE

Based on the prior art, it is necessary to provide a display panel and a device to solve the problem that a resolution of a display panel cannot be effectively improved in the prior art.

A purpose of the present disclosure is to provide a display panel and a device that can improve a resolution.

To solve the above technical problems, the present disclosure provides a display panel, including:
  a first substrate, including:
  a first base substrate;
  a first metal layer disposed on the first base substrate, where the first metal layer includes a plurality of scan lines and a plurality of first metal portions, the first metal portions are configured to form first plates of storage capacitors, each of the first metal portions includes a plurality of second sub-portions arranged along a second direction, the second direction is parallel to data lines;
  a second metal layer disposed on the first metal layer, where the second metal layer includes a plurality of the data lines, one of the second sub-portions is disposed between two adjacent data lines, the data lines and the adjacent second sub-portions are arranged at intervals, in a top view, the display panel includes a plurality of columns of pixels or a plurality of rows of pixels, and each of two sides of each of the columns of pixels is provided with one of the data lines; and
  a first transparent conductive layer disposed on the second metal layer and includes a plurality of pixel electrodes; and
  a second substrate opposite to the first substrate, where the second substrate includes:
  a second base substrate; and
  a second transparent conductive layer disposed under the second base substrate.

Alternatively, in the display panel of the present disclosure, a width of one of the data lines ranges from 1.5 micrometers to 3 micrometers.

Alternatively, in the display panel of the present disclosure, the first substrate further includes:
  a color photoresist layer disposed between the second metal layer and the first transparent conductive layer, the color photoresist layer includes a plurality of color film photoresists, and the first metal portions correspond to abutting positions of two adjacent color film photoresists.

The display panel further includes:
  a black matrix disposed between the second base substrate and the second transparent conductive layer or on the color photoresist layer, and the black matrix corresponds to the abutting positions of two adjacent color film photoresists.

Alternatively, in the display panel of the present disclosure, an orthographic projection of the data line on the first base substrate and an orthographic projection of the black matrix on the first base substrate do not overlap.

Alternatively, in the display panel of the present disclosure, each of the first metal portions further includes a first sub-portion arranged along a first direction, one end of one of the second sub-portions is connected to the first sub-portion, and the first direction is parallel to the scan lines.

Alternatively, in the display panel of the present disclosure, each of two sides of the pixel is provided with one of the second sub-portions.

Alternatively, in the display panel of the present disclosure, two adjacent pixels in each column of pixels are alternately connected to the data lines disposed on two sides of the column of pixels.

Alternatively, in the display panel of the present disclosure, each row of pixels corresponds to one of the scan lines, each pixel includes a thin film transistor, a gate of the thin film transistor is connected to a corresponding scan line, the gate of the thin film transistor is connected to a corresponding data line, and a drain of the thin film transistor is connected to one of the first metal portions and one of the pixel electrodes.

Alternatively, in the display panel of the present disclosure, the display panel further includes a semiconductor layer disposed between the first metal layer and the second metal layer. The semiconductor layer is disposed under the data lines.

Alternatively, in the display panel of the present disclosure, the second transparent conductive layer is configured to form a common electrode.

The present disclosure also provides a display device, including a display panel. The display panel includes:
  a first substrate, including:
  a first base substrate;
  a first metal layer disposed on the first base substrate, where the first metal layer includes a plurality of scan lines and a plurality of first metal portions, the first metal portions are configured to form first plates of storage capacitors, each of the first metal portions includes a plurality of second sub-portions arranged along a second direction, the second direction is parallel to data lines;
  a second metal layer disposed on the first metal layer, where the second metal layer includes a plurality of the data lines, one of the second sub-portions is disposed between two adjacent data lines, the data lines and the adjacent second sub-portions are arranged at intervals, in a top view, the display panel includes a plurality of columns of pixels or a plurality of rows of pixels, and each of two sides of each of the columns of pixels is provided with one of the data lines; and
  a first transparent conductive layer disposed on the second metal layer and includes a plurality of pixel electrodes; and a second substrate opposite to the first substrate, where the second substrate includes:

a second base substrate; and a second transparent conductive layer disposed under the second base substrate.

Alternatively, in the display device of the present disclosure, a width of one of the data lines ranges from 1.5 micrometers to 3 micrometers.

Alternatively, in the display device of the present disclosure, the first substrate further includes:

a color photoresist layer disposed between the second metal layer and the first transparent conductive layer, the color photoresist layer includes a plurality of color film photoresists, and the first metal portions correspond to abutting positions of two adjacent color film photoresists.

The display panel further includes:

a black matrix disposed between the second base substrate and the second transparent conductive layer or on the color photoresist layer, and the black matrix corresponds to the abutting positions of two adjacent color film photoresists.

Alternatively, in the display device of the present disclosure, an orthographic projection of the data line on the first base substrate and an orthographic projection of the black matrix on the first base substrate do not overlap.

Alternatively, in the display device of the present disclosure, each of the first metal portions further includes a first sub-portion arranged along a first direction, one end of one of the second sub-portions is connected to the first sub-portion, and the first direction is parallel to the scan lines.

Alternatively, in the display device of the present disclosure, each of two sides of the pixel is provided with one of the second sub-portions.

Alternatively, in the display device of the present disclosure, two adjacent pixels in each column of pixels are alternately connected to the data lines disposed on two sides of the column of pixels.

Alternatively, in the display device of the present disclosure, each row of pixels corresponds to one of the scan lines, each pixel includes a thin film transistor, a gate of the thin film transistor is connected to a corresponding scan line, the gate of the thin film transistor is connected to a corresponding data line, and a drain of the thin film transistor is connected to one of the first metal portions and one of the pixel electrodes.

Alternatively, in the display device of the present disclosure, the display device further includes a semiconductor layer disposed between the first metal layer and the second metal layer. The semiconductor layer is disposed under the data lines.

Alternatively, in the display device of the present disclosure, the second transparent conductive layer is configured to form a common electrode.

The display panel and device of the present disclosure include the first base substrate. The first metal layer is disposed on the first base substrate. The first metal layer includes the plurality of scan lines and the plurality of first metal portions. The first metal portions are configured to form the first plates of the storage capacitors. The first metal portion includes the plurality of second sub-portions arranged along the second direction. The second direction is parallel to the data lines. The second metal layer is disposed on the first metal layer. The second metal layer includes the plurality of data lines. The second sub-portion is disposed between two adjacent data lines. The data lines and the adjacent second sub-portions are arranged at intervals. In the top view, the display panel includes the plurality of columns of pixels or the plurality of rows of pixels. Each of two sides of each of the columns of pixels is provided with one of the data lines. The first transparent conductive layer is disposed on the second metal layer and includes the plurality of pixel electrodes. The second substrate is disposed opposite to the first substrate, and includes the second base substrate. The second transparent conductive layer is disposed under the second base substrate. Since an existing panel structure is adjusted, a number of pixels has been increased, and a resolution has been improved.

DETAILED DESCRIPTION

Figure 1:
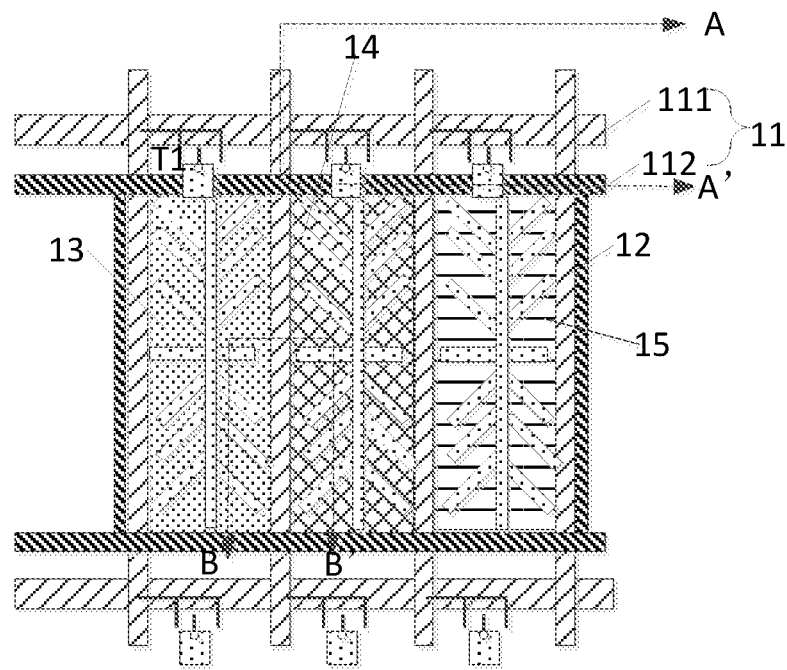
FIG. 1 is a top view of a display panel in the prior art.

A description of following embodiments refers to accompanying drawings to illustrate specific embodiments that can be implemented by the present disclosure. Direction terms mentioned in the present disclosure, such as "up", "down", "front", "back", "left", "right", "in", "out", "side", etc., only refer to directions of the accompanying drawings. Therefore, the used directional terms are configured to explain and understand the present disclosure, not to limit the present disclosure. In the drawings, units with similar structures are indicated by the same reference numerals.

Terms, such as "first", "second", etc., in the specification and claims of this application and the above-mentioned drawings are used to distinguish different objects, rather than to describe a specific order. In addition, terms, such as "including" and "having" and any variations of them, are intended to cover a non-exclusive inclusion.

Figure 2:
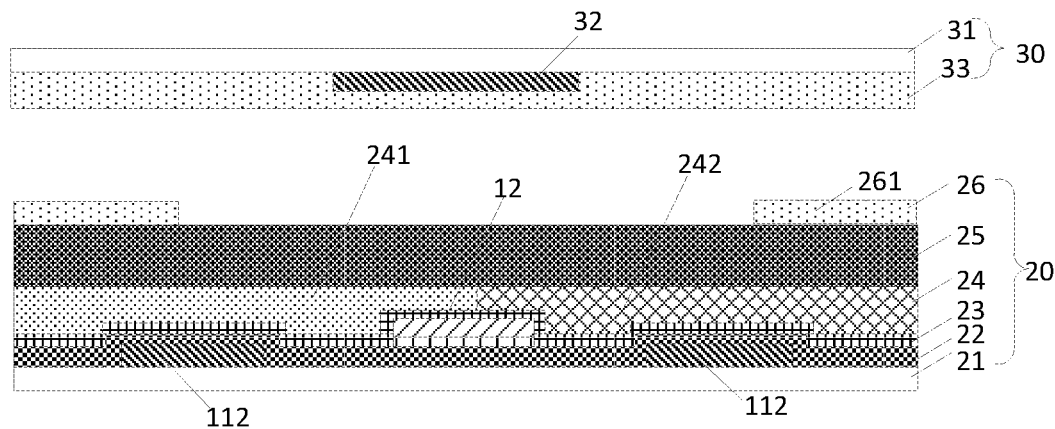
FIG. 2 is a cross-sectional view of the display panel in FIG. 1 along a line B-B'.
Figure 3:
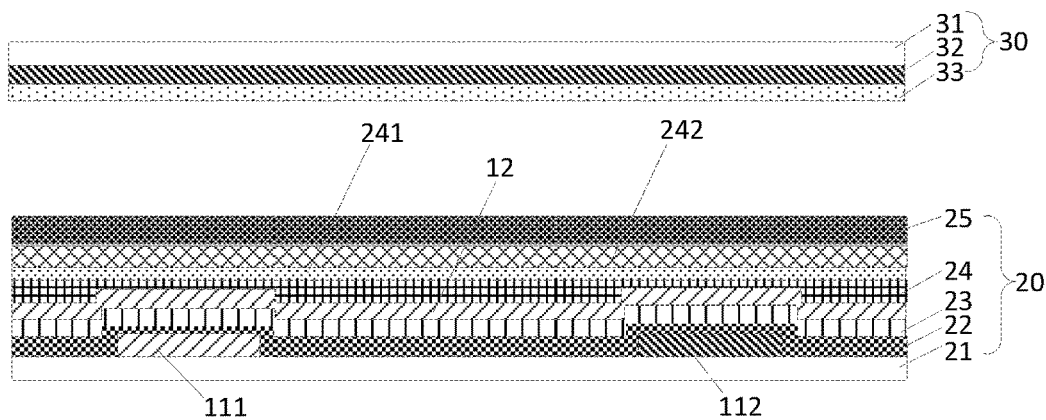
FIG. 3 is a cross-sectional view of the display panel in FIG. 1 along a line A-A'.

As shown in FIG. 1 to FIG. 3, an existing display panel includes a plurality of scan lines 111 and a plurality of data lines 12. The data lines 12 and scan lines 111 define a plurality of pixels, such as a pixel 13, a pixel 14, and a pixel 15. A gate of a thin film transistor T1 is connected to the scan line 111, a source of the thin film transistor T1 is connected to the data line 12, and a drain of the thin film transistor T1 is connected to a first plate 112 of a storage capacitor and a pixel electrode 261.

Referring to FIG. 2 and FIG. 3, a cross-sectional structure of the existing display panel includes a first substrate 20 and a second substrate 30.

The first substrate 20 includes a first base substrate 21, a first metal layer 11, an insulating layer 22, a second metal layer (not shown in the drawings), a passivation layer 23, a color photoresist layer 24, a protective layer 25, and a first transparent conductive layer 26.

The color photoresist layer 24 is disposed on the passivation layer 23. The color photoresist layer 24 includes a plurality of color film photoresists, such as a red color film 241, a green color film 242, and a blue color film.

The second substrate 30 includes a second base substrate 31, a black matrix 32, and a second transparent conductive layer 33. Referring to FIG. 3, all of the data lines 12 are covered with the black matrix 32. If a number of the data lines 12 is increased, an aperture will decrease.

Figure 4:
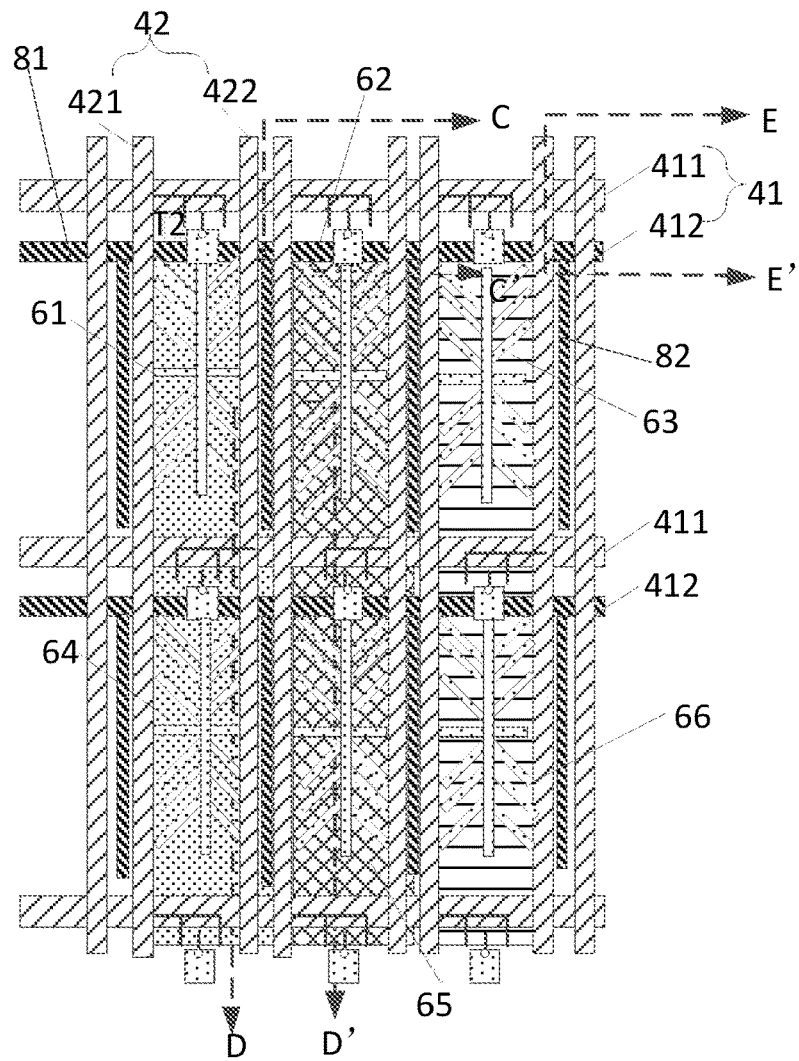
FIG. 4 is a top view of a display panel of an embodiment of the present disclosure.

Referring to FIG. 4 to FIG. 7. FIG. 4 is a top view of a display panel of an embodiment of the present disclosure.

Referring to FIG. 4 to FIG. 7, in the top view, the display panel of this embodiment includes a plurality of pixels, such as a pixel 61, a pixel 62, a pixel 63, a pixel 64, a pixel 65, and a pixel 66. The plurality of pixels form a pixel matrix, that is, the display panel includes a plurality of columns of pixels or a plurality of rows of pixels.

Figure 5:
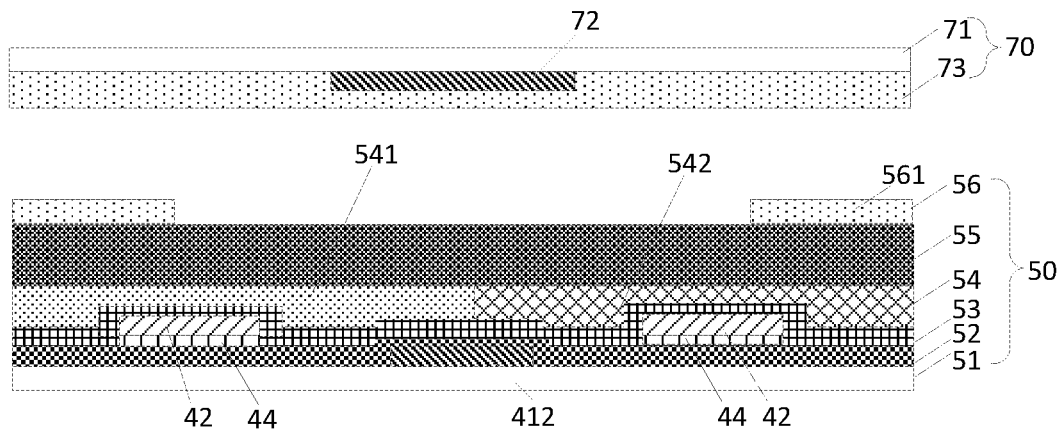
FIG. 5 is a cross-sectional view of the display panel in FIG. 4 along a line D-D'.

Referring to FIG. 5, the display panel of this embodiment includes a first substrate 50 and a second substrate 70.

The first substrate 50 includes a first base substrate 51, a first metal layer 41, an insulating layer 52, a semiconductor layer 44, a second metal layer (not shown in the drawings), a passivation layer 53, a color photoresist layer 54, a protective layer 55, and a first transparent conductive layer 56.

The first metal layer 41 is disposed on the first base substrate 51. The first metal layer 41 includes a plurality of scan lines 411 and a plurality of first metal portions 412. The first metal portions 412 are configured to form first plates of storage capacitors. Referring to FIG. 4, the first metal portion 412 includes a first sub-portion 81 arranged along a first direction and a plurality of second sub-portions 82 arranged along a second direction. One end of each second sub-portion 82 is connected to the first sub-portion 81. The first direction is parallel to the scan lines 411. The second direction is parallel to a data line 42.

The insulating layer 52 is disposed on the first metal layer 41, and the insulating layer 52 can be made of SiNx, SiOx, or other materials.

The semiconductor layer 44 is disposed between the first metal layer 41 and the second metal layer. The semiconductor layer 44 is configured to form channels of thin film transistors.

The second metal layer is disposed on the first metal layer 41. The second metal layer includes plurality of the data lines 42. One of the second sub-portions 82 is disposed between two adjacent data lines 42. In order to save a number of masks and simplify a manufacturing process, in one embodiment, the data lines 42 are disposed above the semiconductor layer 44. In one embodiment, in order to further improve a transmittance, the data lines 42 and the adjacent second sub-portions 82 are arranged at intervals. In order to further improve the transmittance, each of two sides of each pixel is provided with one of the second sub-portions 82. An orthographic projection of the second sub-portion 82 on the first base substrate 51 partially overlaps an orthographic projection of an edge of each of two sides of a corresponding color film photoresist on the first base substrate 51. Materials of the second metal layer and the first metal layer 41 may include at least one of Mo, Al, Ti, or Cu. In one embodiment, a width of the data line 42 may range from 1.5 um to 3 um. By reducing the width of the data line, a gap between the data line and the second sub-portion is increased, thereby further increasing the aperture. Since the first metal portion is disposed between two adjacent data lines, a loss of the aperture caused by the increased data lines can be compensated by the gap between the first metal portions and the data lines, so as to avoid affecting the aperture.

The passivation layer 53 is disposed on the second metal layer. Material of the passivation layer 53 may include at least one of $SiO_2$, SiNx, or SiON.

The color photoresist layer 54 is disposed on the passivation layer 53. The color photoresist layer 54 includes a plurality of color film photoresists, such as a red color film 541, a green color film 542, and a blue color film. Referring to FIG. 5, each the first metal portion 412 corresponds to a position of two adjacent color film photoresists. The first metal portions 412 cover abutting positions of two adjacent color film photoresists. Each side of two side of column of color film photoresists is provided with one of the data lines. For example, taking the red color films in a first column as an example, a data line 421 and a data line 422 are disposed on both sides of the color film photoresists in the first column, and the color film photoresists in other columns are the same.

The protective layer 55 is disposed on the color photoresist layer 54. Material of the protective layer 55 may include at least one of $SiO_2$, SiNx, or SiON.

The first transparent conductive layer 56 is disposed on the color photoresist layer 54. The transparent conductive layer 56 includes a plurality of pixel electrodes 561. The pixel electrodes 561 correspond to the color film photoresists. In one embodiment, a storage capacitor is formed between the pixel electrode 561 and the first metal portion 412. Material of the first transparent conductive layer 56 may be indium tin oxide.

The second substrate 70 is disposed opposite to the first substrate 50. The second substrate 70 includes a second base substrate 71, a black matrix 72, and a second transparent conductive layer 73, and the black matrix 72 and the second transparent conductive layer 73 are sequentially disposed under the second base substrate 71. Material of the second transparent conductive layer 73 may be indium tin oxide.

Figure 6:
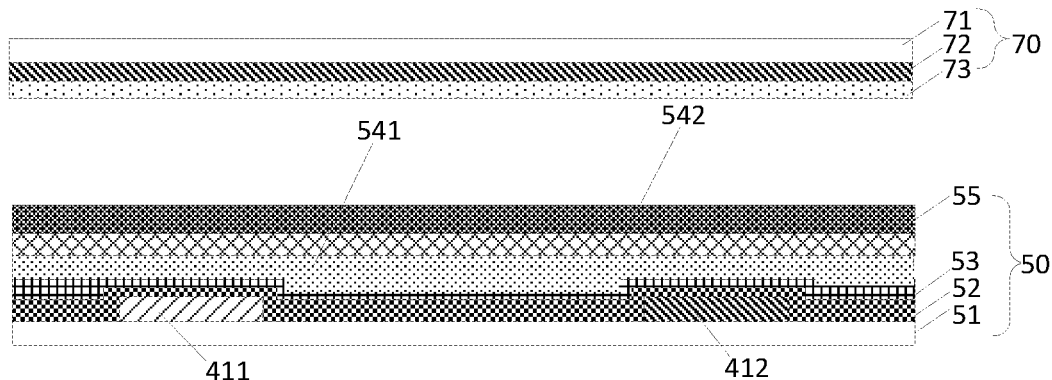
FIG. 6 is a cross-sectional view of the display panel in FIG. 4 along a line C-C'.
Figure 7:
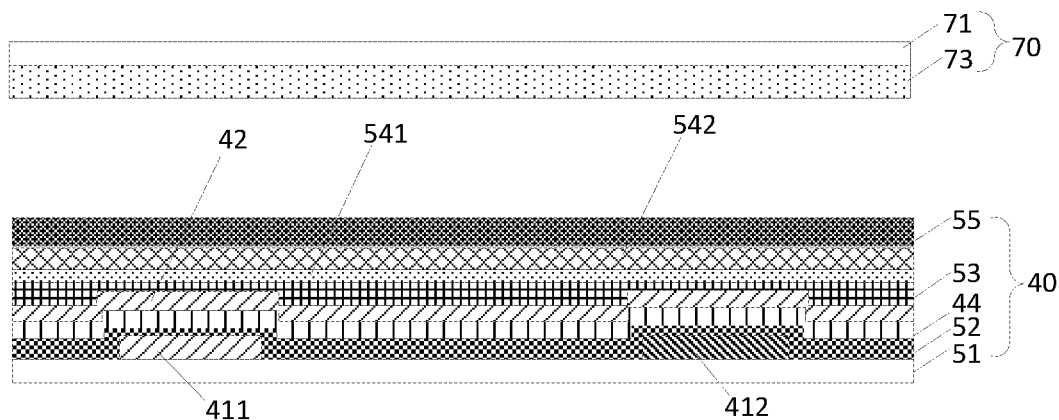
FIG. 7 is a cross-sectional view of the display panel in FIG. 4 along a line E-E'.

Referring to FIG. 6 and FIG. 7, the black matrix 72 corresponds to the abutting positions of two adjacent color film photoresists. In one embodiment, in order to improve the transmittance of the display panel, an orthographic projection of the data lines 42 on the first base substrate 51 and an orthographic projection of the black matrix 72 on the first base substrate 51 do not overlap. That is, the black matrix 72 is not covered on the data lines 42. In FIG. 7, taking one data line as an example for illustration, it is understandable that the other data lines are not covered with black matrix.

The second transparent conductive layer 73 is configured to form common electrodes.

Two adjacent pixels in each column of pixels are alternately connected to the data lines disposed on two sides of the column of pixels. For example, the first pixel 61 in the first column of pixels is connected to the data line 421 on the left, the second pixel 64 in the first column of pixels is connected to the data line 422 on the right, and the other pixels are similar. In FIG. 4, only 6 pixels are shown, but it does not limit the present disclosure.

Each row of pixels corresponds to one scan line 411. The pixel includes a thin film transistor T2. A gate of the thin film transistor T2 is connected to a corresponding scan line 411. A gate of the thin film transistor T2 is connected to a corresponding data line 42. A drain of the thin film transistor T2 is connected to the first metal portion 412 and the pixel electrode 561.

The display panel of this embodiment may be a liquid crystal display panel, and the display panel may further include a liquid crystal layer. The liquid crystal layer is disposed between the first substrate 50 and the second substrate 70.

It can be understood that a structure of the display panel of the present disclosure is not limited to this. For example, in other embodiments, the color photoresist layer is disposed on the second substrate. In other embodiments, the black matrix is disposed on the first substrate. For example, the black matrix is disposed on the color photoresist layer or on a same layer as the color photoresist layer.

Due to an existing panel structure is adjusted, a number of data lines and scan lines has been increased at the same time, thereby increasing a number of pixels, and increasing a resolution. In addition, because the second sub-portion is disposed between two adjacent data lines, the aperture can be increased through the gap between the data line and the second sub-portion, thereby preventing a low aperture due to an increase of the data lines.

The present disclosure also provides a display device, which includes any of the above-mentioned display panels. The display device may also include a backlight module.

The display panel and device of the present disclosure include the first base substrate. The first metal layer is disposed on the first base substrate. The first metal layer includes the plurality of scan lines and the plurality of first metal portions. The first metal portions are configured to form the first plates of the storage capacitors. The first metal portion includes the plurality of second sub-portions arranged along the second direction. The second direction is parallel to the data lines. The second metal layer is disposed on the first metal layer. The second metal layer includes the plurality of data lines. The second sub-portion is disposed between two adjacent data lines. The data lines and the adjacent second sub-portions are arranged at intervals. In the top view, the display panel includes the plurality of columns of pixels or the plurality of rows of pixels. Each of two sides of each of the columns of pixels is provided with one of the data lines. The first transparent conductive layer is disposed on the second metal layer and includes the plurality of pixel electrodes. The second substrate is disposed opposite to the first substrate, and includes the second base substrate. The second transparent conductive layer is disposed under the second base substrate. Since the existing panel structure is adjusted, the number of pixels has been increased, and the resolution has been improved.

In summary, although the present disclosure has been disclosed as above in preferred embodiments, the above preferred embodiments are not intended to limit the present disclosure. Those of ordinary skill in the art can make various changes and modifications without departing from a spirit and a scope of the present disclosure. Therefore, the protection scope of the present disclosure is subject to a scope defined by the claims.

What is claimed is:

1. A display panel, comprising:
   a first substrate, comprising:
      a first base substrate;
      a first metal layer disposed on the first base substrate, wherein the first metal layer comprises a plurality of scan lines and a plurality of first metal portions, the first metal portions are configured to form first plates of storage capacitors, each of the first metal portions includes a plurality of second sub-portions arranged along a second direction, the second direction is parallel to data lines;
      a second metal layer disposed on the first metal layer, wherein the second metal layer comprises a plurality of the data lines, one of the second sub-portions is disposed between two adjacent data lines, the data lines and the adjacent second sub-portions are arranged at intervals, in a top view, the display panel comprises a plurality of columns of pixels or a plurality of rows of pixels, and each of two sides of each of the columns of pixels is provided with one of the data lines; and
      a first transparent conductive layer disposed on the second metal layer and comprising a plurality of pixel electrodes;
   a second substrate opposite to the first substrate, wherein the second substrate comprises:
      a second base substrate; and
      a second transparent conductive layer disposed under the second base substrate; and
   a black matrix disposed between the second base substrate and the second transparent conductive layer or on the color photoresist layer,
   wherein an orthographic projection of the data lines on the first base substrate and an orthographic projection of the black matrix on the first base substrate do not overlap.

2. The display panel according to claim 1, wherein a width of one of the data lines ranges from 1.5 micrometers to 3 micrometers.

3. The display panel according to claim 1, wherein the first substrate further comprises a color photoresist layer disposed between the second metal layer and the first transparent conductive layer, the color photoresist layer comprises a plurality of color film photoresists, and the first metal portions correspond to the abutting positions of two adjacent color film photoresists; and
   wherein the black matrix corresponds to the abutting positions of two adjacent color film photoresists.

4. The display panel according to claim 1, wherein each of the first metal portions further comprises a first sub-portion arranged along a first direction, one end of one of the second sub-portions is connected to the first sub-portion, and the first direction is parallel to the scan lines.

5. The display panel according to claim 4, wherein each of two sides of the pixels is provided with one of the second sub-portions.

6. The display panel according to claim 1, wherein two adjacent pixels in each column of pixels are alternately connected to the data lines disposed on two sides of the column of pixels.

7. The display panel according to claim 6, wherein each row of pixels corresponds to one of the scan lines, each pixel comprises a thin film transistor, a gate of the thin film transistor is connected to a corresponding scan line, the gate of the thin film transistor is connected to a corresponding data line, and a drain of the thin film transistor is connected to one of the first metal portions and one of the pixel electrodes.

8. The display panel according to claim 1, further comprising a semiconductor layer disposed between the first metal layer and the second metal layer, wherein the semiconductor layer is disposed under the data lines.

9. The display panel according to claim 1, wherein the second transparent conductive layer is configured to form a common electrode.

10. A display device, comprising a display panel, wherein the display panel comprises:
    a first substrate, comprising:
       a first base substrate;
       a first metal layer disposed on the first base substrate, wherein the first metal layer comprises a plurality of scan lines and a plurality of first metal portions, the first metal portions are configured to form first plates of storage capacitors, each of the first metal portions includes a plurality of second sub-portions arranged along a second direction, the second direction is parallel to data lines;
a second metal layer disposed on the first metal layer, wherein the second metal layer comprises a plurality of the data lines, one of the second sub-portions is disposed between two adjacent data lines, the data lines and the adjacent second sub-portions are arranged at intervals, in a top view, the display panel comprises a plurality of columns of pixels or a plurality of rows of pixels, and each of two sides of each of the columns of pixels is provided with one of the data lines; and
a first transparent conductive layer disposed on the second metal layer and comprising a plurality of pixel electrodes;
a second substrate opposite to the first substrate, wherein the second substrate comprises:
a second base substrate; and
a second transparent conductive layer disposed under the second base substrate; and
a black matrix disposed between the second base substrate and the second transparent conductive layer or on the color photoresist layer,
wherein an orthographic projection of the data lines on the first base substrate and an orthographic projection of the black matrix on the first base substrate do not overlap.

11. The display device according to claim 10, wherein a width of one of the data lines ranges from 1.5 micrometers to 3 micrometers.

12. The display device according to claim 10, wherein the first substrate further comprises a color photoresist layer disposed between the second metal layer and the first transparent conductive layer, the color photoresist layer comprises a plurality of color film photoresists, and the first metal portions correspond to abutting positions of two adjacent color film photoresists; and
wherein the black matrix corresponds to the abutting positions of two adjacent color film photoresists.

13. The display device according to claim 10, wherein each of the first metal portions further comprises a first sub-portion arranged along a first direction, one end of one of the second sub-portions is connected to the first sub-portion, and the first direction is parallel to the scan lines.

14. The display device according to claim 13, wherein each of two sides of the pixels is provided with one of the second sub-portions.

15. The display device according to claim 10, wherein two adjacent pixels in each column of pixels are alternately connected to the data lines disposed on two sides of the column of pixels.

16. The display device according to claim 15, wherein each row of pixels corresponds to one of the scan lines, each pixel comprises a thin film transistor, a gate of the thin film transistor is connected to a corresponding scan line, the gate of the thin film transistor is connected to a corresponding data line, and a drain of the thin film transistor is connected to one of the first metal portions and one of the pixel electrodes.

17. The display device according to claim 10, further comprising a semiconductor layer disposed between the first metal layer and the second metal layer, wherein the semiconductor layer is disposed under the data lines.

18. The display device according to claim 10, wherein the second transparent conductive layer is configured to form a common electrode.

19. A display panel, comprising:
a first substrate, comprising:
a first base substrate;
a first metal layer disposed on the first base substrate, wherein the first metal layer comprises a plurality of scan lines and a plurality of first metal portions, the first metal portions are configured to form first plates of storage capacitors, each of the first metal portions includes a plurality of second sub-portions arranged along a second direction, the second direction is parallel to data lines;
a second metal layer disposed on the first metal layer, wherein the second metal layer comprises a plurality of the data lines, one of the second sub-portions is disposed between two adjacent data lines, the data lines and the adjacent second sub-portions are arranged at intervals, in a top view, the display panel comprises a plurality of columns of pixels or a plurality of rows of pixels, and each of two sides of each of the columns of pixels is provided with one of the data lines; and
a first transparent conductive layer disposed on the second metal layer and comprising a plurality of pixel electrodes;
a second substrate opposite to the first substrate, wherein the second substrate comprises:
a second base substrate; and
a second transparent conductive layer disposed under the second base substrate; and
a semiconductor layer disposed between the first metal layer and the second metal layer, wherein the semiconductor layer is correspondingly disposed under the data lines.

* * * * *